United States Patent [19]
La Chapelle, Jr.

[11] Patent Number: 5,366,934
[45] Date of Patent: Nov. 22, 1994

[54] METHOD FOR SULFIDE SURFACE PASSIVATION

[75] Inventor: Theodore J. La Chapelle, Jr., Orange, Calif.

[73] Assignee: Rockwell International Corporation, Seal Beach, Calif.

[21] Appl. No.: 310,034

[22] Filed: Feb. 10, 1989

Related U.S. Application Data

[63] Continuation-in-part of Ser. No. 61,376, Jun. 15, 1987, abandoned.

[51] Int. Cl.$^5$ .................... H01L 21/00; H01L 21/02
[52] U.S. Cl. .................... 437/225; 437/235; 437/237; 437/244; 437/965; 148/270
[58] Field of Search .............. 437/244, 235, 965, 225, 437/237; 148/270, 271

[56] References Cited

U.S. PATENT DOCUMENTS 4,876,222 10/1989 Lüttmer ........................ 437/235

OTHER PUBLICATIONS

Nemirovsky, J. Appl. Phys 58(1) Jul. 1985 pp. 366–444.

Primary Examiner—Sam Silverberg
Attorney, Agent, or Firm—H. Fredrick Hamann; George A. Montanye; Tom Streeter

[57] ABSTRACT

A purely chemical method for forming a layer of insoluble sulfides on semiconductor surfaces in order to passivate their surfaces and more particularly to a method of forming a layer of insoluble sulfides on a HgCdTe device surface.

10 Claims, 2 Drawing Sheets

METHOD FOR SULFIDE SURFACE PASSIVATION

This is a continuation-in-part of application Ser. No. 07/061,376, filed Jun. 15, 1987, now abandoned and incorporated herein by reference.

BACKGROUND OF THE INVENTION

1. Field of the Invention

This invention relates to a purely chemical method for forming a layer of insoluble sulfides on semiconductor devices to passivate their surfaces and more particularly to a method of forming a layer of insoluble sulfides on a mercury cadmium telluride ($Hg_{1-x}Cd_xTe$) device surface in order to passivate the device surface.

2. Description Of The Prior Art

The description of the prior art that follows references processes involving $Hg_{1-x}Cd_xTe$. It is to be appreciated that the prior art processes can be practiced in connection with substances other than $Hg_{1-x}Cd_xTe$. More particularly, the method contemplated by the instant invention can be used with any semiconductor whose surface atoms will form stable insoluble sulfides. Accordingly, for the purposes of the description of the prior art, the utilization of methods with respect to $Hg_{1-x}Cd_xTe$ will be examined as a specific example. It is against this back-drop of prior art examples that the advance contemplated by the present invention can be better appreciated.

$Hg_{1-x}Cd_xTe$ is typically used in the manufacture of infrared (IR) detectors. Depending upon its composition or the value of x in its compositional formula it will operate over a wide range of wavelength regions. The wavelength of use depends on both the $Hg_{1-x}Cd_xTe$ composition and the temperature at which it is used.

Surface properties have long been known to dominate many of the characteristics of pn semiconductor junctions of small geometry in $Hg_{1-x}Cd_xTe$ and in other semiconductors. It is therefore important to have a suitable passivation process for this material in order to enhance and preserve the best detector properties. Passivation stabilizes the surface properties of a device.

Sulfidization as a passivation for semiconductors is a possible choice if the chemical literature indicates that a sulfide of one (or more) of the constituent elements is known form a stable sulfide. If the oxide of the constituent presents to the semiconductor device either chemical or electrical difficulties as a passivating agent (either during fabrication or in finished form) then the sulfide may be a useful alternative. Furthermore, if the sulfide is known to be insoluble, then the present chemical technique may be a viable passivation solution.

Heretofore, there have been at least two general types of passivation used for $Hg_{1-x}Cd_xTe$ or other semiconductors. The first has been the growth of compounds on semiconductor surfaces using reactions which form the passivation film from the surface atoms of the semiconductor. The second type has been the deposition of foreign materials onto the surface of the semiconductor in order to generate this passivation.

In the first category there have been various insulators and semiconductors deposited onto the surface of the semiconductor. When the semiconductor is $Hg_{1-x}Cd_xTe$, these materials include cadmium telluride, silicon dioxide, and other highly resistive materials. In the second category the principal growth has been of films of oxides including native oxides that grow naturally on the surfaces of any semiconductor material exposed to air or moisture or water solutions, as well as oxides generated anodically or thermally or in plasmas.

It is well known in the art that native oxides on $Hg_{1-x}Cd_xTe$ and many other semiconductors possess positive fixed charges which can invert the surfaces of p-type material. Therefore, even though native oxides often form high quality surface passivation for n-type material, they are inadequate for devices on p-type material. The latter material is normally used for photovoltaic infrared detectors.

In the second category, layers utilizing thin film deposition techniques have included materials such as evaporated zinc sulfide as well as silicon dioxide photochemically deposited at low temperatures. Deposited zinc sulfide tends to form moderately good interfaces on freshly etched $Hg_{1-x}Cd_xTe$ or a few other semiconductor surfaces; however, inconsistent interfaces are often obtained on surfaces which have been exposed to chemicals during the processing cycle. In addition, excessive low frequency 1/f noise is often measured in these latter devices. This type of noise increases with reverse bias and is detrimental for the proper functioning of photovoltaic devices. Low temperature chemical vapor-deposited (CVD) silicon dioxide ($SiO_2$), often photochemically assisted in growth, exhibits somewhat improved interface properties which may be used in conjunction with heterojunction detectors. However, $SiO_2$ is absorbent above approximately 7 microns and is thus not suitable as coating for front illuminated 8 to 12 micron diodes. In addition, there are some adherence problems associated with deposited $SiO_2$. The best results using $SiO_2$ have been obtained if a few layers of natural or native oxide are present on the $Hg_{1-x}Cd_xTe$ or other semiconductor before the $SiO_2$ deposition; and even an extremely thin film, less that 100 Angstroms of native oxide, appears to protect the crystal against damage and also appears to improve adherence. This historical background illustrates the fact that native films can be indispensable for appropriately terminating the lattice while creating the minimum perturbation to the crystal lattice at the surface. The art of passivating films has not been limited to native oxides. More particularly, Nemirovsky and her associates at the Microelectronics Research Center, Department of Electrical Engineering at the Israeli Institute of Technology, have disclosed work relating to anodically deposited sulfide films on $Hg_{1-x}Cd_xTe$. Their initial results were reported in Applied Physics Letters, Vol. 44, No. 4, Feb. 15, 1984, page 443. A later and more detailed paper appeared in the Journal of Applied Physics, Vol. 58, No. 10, Jul. 1, 1985, page 366. The group also disclosed additional data in a paper presented at the 1985 U.S. Workshop on the Physics and Chemistry of Mercury Cadmium Telluride, Oct. 10, 1985, at San Diego.

In general terms, prior art anodic sulfidization is accomplished utilizing nonaqueous solutions of ethylene glycol in combination with dissolved sodium sulfide to produce the sulfide ion. These solutions are strongly basic, having a pH near 12. A constant current density of 60 to 140 microamperes per square centimeter is typically used in the process as the applied potential. The films grown using this prior art process have a thickness normally between the range of 400 to 500 Angstroms and at times up to as high as 600 Angstroms. On top of the anodized sulfide film approximately 3000 Angstroms or 0.3 micron of zinc sulfide is deposited by evaporation techniques.

In her 1985 article, Nemirovsky states:

"The formation of native sulfide films may be extended to additional compound semiconductors. In particular, it has been successfully applied to the III-V narrow band-gap semiconductor InSb, where a native film of indium sulfide forms an excellent interface."

Just as the anodic method of Nemirovsky may be extended to additional compound semiconductors, the nonanodic method of the present invention may also be extended to additional compound semiconductors. While, in general, the ratio of the constituent elements of the semiconductor will be much different from the ratio of the constituent elements of the sulfide film (as Nemirovsky points out, only the indium, and not the antimony, forms a sulfide film), the resulting sulfide film has many useful characteristics. Compound semiconductors, one or more of the elements of which forms stable sulfides, are well known in the art. The present invention discloses a method whereby native films of such sulfides on such semiconductors may be formed with a nonanodic process, to complement the anodic process of Nemirovsky et al.

There are some inherent disadvantages of the anodic process. Firstly, it is an electrochemical process or an anodization which takes place in a solution under an applied potential. Such a process requires the attachment of electrodes on the semiconductor substrate in order to have it act as one of the electrodes in solution. These electrodes must later be removed from the substrate. Not only do the electrodes act as sources of contamination, but also, the application and removal of the electrodes increases the likelihood of physically damaging the substrate as well as the semiconductor devices thereon.

Secondly, the anodic methods typically use films of thickness 400 to 600 Angstroms. Films of such, or increased, thickness, especially when prepared by anodization, often can result in layers which are structurally non-uniform and which inevitably are not free of stress or structural imperfections. The latter type defects are most clearly seen in the case of anodized aluminum oxide films wherein the structure in thicker films eventually leads to columnar growth (a structural nonuniformity) which is not desirable in good passivating layers. Columnar growth is associated with less perfect structures and often has less dense or even porous material properties.

Thirdly, the nonaqueous solutions of ethylene glycol in combination with dissolved sodium sulfide contain sodium ions which are difficult to remove from semiconductor surfaces because they adsorb strongly. Lastly, these solutions are strongly basic and thus tend to destructively attack the surfaces being treated.

In summary, although the anodization techniques do appear to yield improved photovoltaic devices because of their passivation properties, the method used is difficult to apply to semiconductor manufacturing technology in high volume and with high yield. Anodization processes offer possible contamination effects and nonuniformity, together with yield losses due to the difficulties in attaching/removing contacts to semiconductor structures or wafers. They involve solutions that are both strongly basic and contain contaminating sodium ions. Sodium ions are difficult to remove from semiconductor surfaces since they adsorb strongly. Basic solutions, especially strong alkaline concentrations of high pH, are able to destructively attack $Hg_{1-x}Cd_xTe$ and other semiconductor surfaces (e.g., strong basic solutions can be used to destructively pit semiconductor surfaces to reveal imperfections).

From the foregoing, the need should be appreciated for a new and improved method for passivation of $Hg_{1-x}Cd_xTe$ and other semiconductor surfaces. More particularly, a method for passivation of semiconductor surfaces creating a passivating film that has the following qualities is desirable:

The layers adhere well to the surface because they are formed thereof;

The layers result in a low semiconductor interface charge density and low semiconductor recombination velocity;

They are stable with respect to their influence on electrical properties, producing low surface leakage and high $R_oA$ values, which in turn result in a high performance and reduced noise of finished detector devices; and The layers are compatible with device fabrication processes and are mechanically and thermally stable.

Accordingly, a fuller understanding of the invention may be obtained by referring to the SUMMARY OF THE INVENTION, and the DETAILED DESCRIPTION OF THE PREFERRED EMBODIMENT, in addition to the scope of the invention defined by the claims in conjunction with the accompanying drawings.

SUMMARY OF THE INVENTION

The invention is defined by the appended claims with embodiments diagrammed in the attached drawings. For purposes of summarizing the invention the method, generally and in basic terms, comprises the steps of surface oxide removal, surface material etching, etch quenching, rinsing or flushing subsequent to the etch quenching, sulfide soaking, final rinsing and drying.

More specifically, the surface passivation process described herein produces a true native sulfide whose thickness is limited to a number of monolayers. The technique is purely chemical in nature and is easily adaptable to large volume production, thereby resulting in a low cost technique. The process takes advantage of the natural tendency of some of the atoms of the semiconductor (such as the metal atoms of the HgCdTe) to form very insoluble compounds of sulfur, and to do so in a very uniform reproducible manner. The method passivates the semiconductor surface in that it reduces its reactivity (to ambient gases or moisture), minimizes surface leakage and produces low surface recombination velocities thereon. In stabilizing the material chemically the process also restricts or severely reduces the tendency of any volatile constituent of the semiconductor to out-diffuse from the semiconductor, especially in low pressure high temperature environments (e.g., mercury can be lost from a $Hg_{1-x}Cd_xTe$ surface under ward conditions of a few hundred degrees Centigrade).

It is an object of this invention to provide a method which overcomes the aforementioned inadequacies of the prior art methods of passivation for semiconductor surfaces.

Another object of this invention is to generate a passivation surface consisting of native sulfides of said surface by a purely chemical technique.

It is another object of this invention to provide a passivation layer of native sulfide of extremely thin, approximately 50 Angstroms or less, thickness on the surface of semiconductor devices.

It is still a further object of this invention to provide a passivation sulfide layer on semiconductor surfaces which does not involve easily adsorbed ions or other contaminate materials which are detrimental to the device properties.

It is yet another object of this invention to produce a passivation sulfide film on the surface of a semiconductor by a method which is compatible with device fabrication manufacturing processes.

Another object of this invention is to provide a surface passivation film on semiconductor surfaces generated in situ on said surfaces by the formation of extremely insoluble compounds out of either aqueous or organic solutions.

A further object of the invention is to produce a passivation sulfide film on semiconductor surfaces by entirely gaseous reactions involving the combination of sulfide bearing gases with surface atoms of the semiconductor.

Another object of the invention is to produce a passivating film on a device which shows little or no perimeter dependence during low temperature operation.

An additional object of this invention is to provide a method of quenching a chemical etch of a semiconductor surface with a sulfide-containing gas or solution which will thereby generate in situ the necessary passivating film.

Yet another object of this invention is to provide a passivating film on the surface of semiconductor devices which will reduce surface leakage and improve the $R_oA$ values for this type of infrared detector.

It is yet another object of this invention to reproducibly and uniformly improve the surface properties of semiconductor devices so that their surface recombination velocities are very low in value and thereby nearly nullify any detrimental surface effects on photovoltaic device performance.

The foregoing SUMMARY OF THE INVENTION outlines some of the more pertinent objects of the invention. The objects should be construed to be merely illustrative of some of the more prominent features and applications of the intended invention. Many other beneficial results can be obtained by applying the disclosed invention in a different manner or modifying the invention within the scope of the disclosure. The summary outlines rather broadly the more pertinent and important features of the present invention in order that the detailed description of the invention that follows may be better understood so that the present contribution to the art can be more fully appreciated.

Additional features of the invention will be described hereinafter which will form the subject of the claims of the invention. It should be appreciated by those skilled in the art that the conception of the specific embodiments disclosed may be readily utilized as a basis for modifying or developing other methods for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Further objects and advantages of the present invention will become apparent as the following DESCRIPTION OF THE PREFERRED EMBODIMENT proceeds taken in conjunction with the accompanying drawings in which.

DESCRIPTION OF THE PREFERRED EMBODIMENTS

The present invention is concerned with the purely chemical formation of insoluble sulfides on semiconductor surfaces, and more particularly to the passivation of HgCdTe surfaces. At least six variations of the technique contemplated by the invention can be described. Each of the varied embodiments of the invention described herein are practiced during the last stages of device fabrication subsequent to junction formation.

Figure 1:
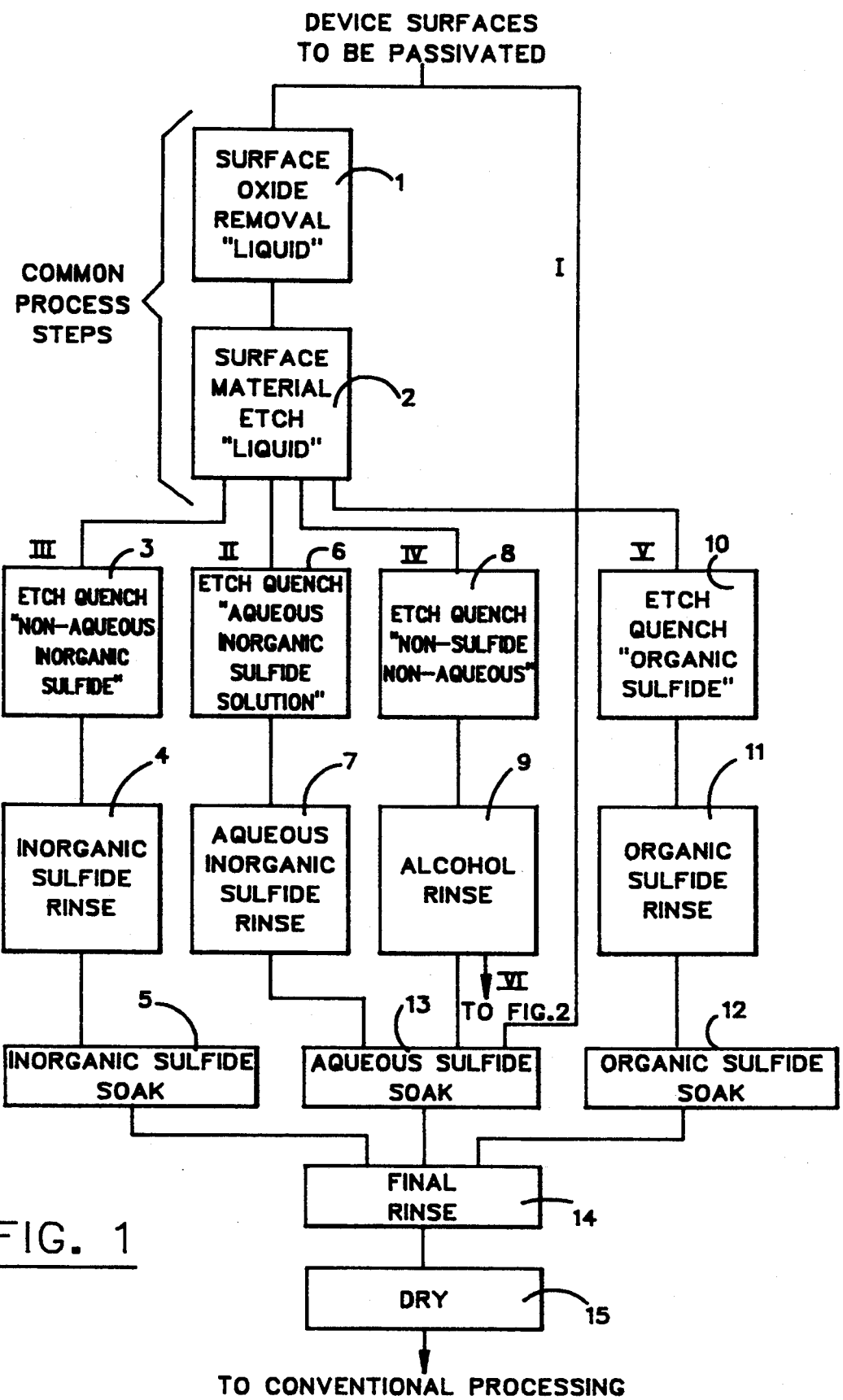
FIG. 1 Diagrammatic flow chart of illustrating five embodiments of the sulfide surface passivation process.

Referring now to FIG. 1, a diagrammatic flow chart is provided, illustrating five preferred embodiments of the present invention. Embodiments II, III, IV, V and VI each respectively includes a surface oxide removal step 1 and a surface material etch step 2 (referred to in FIG. 1 as "common process steps)." The purposes of the etching and oxide removal throughout each of the embodiments excluding embodiment I, which does not require an etch or oxide removal, is to remove any nonstoichiometric surface layer on the semiconductor surface so that the properties of the remaining material are more representative of the underlying bulk material.

A surface material etch is preferably applied where device junction(s) have been generated by conventional ion implantation procedures. Oxide removal and surface etchings are optional depending on the technique used in junction formation and upon the condition of the semiconductor surface following junction formation. For example, as shown in FIG. 1, embodiment I entirely bypasses the surface oxide removal step 1 and the surface material etch 2. This situation is generally applicable when the semiconductor surface to be passivated has been generated for example, in a vacuum system or by some other technique where there has been very little chance for any oxidation of the semiconductor material surface. A surface having little or no oxidation is more representative of the underlying bulk material, and is desirable for effective passivation.

The surface oxide removal step 1, as indicated in FIG. 1 may utilize several different chemical liquids to remove unwanted oxides from the surface of the semiconductor being treated. Typically, the semiconductor to be passivated is placed into any of the following solutions, nominally for a 5 second duration. This duration, however, is not critical to the process. The length of time in the solution preferably ranges from 5 to 20 seconds, or long enough for the unwanted oxides to be removed. Any of the following solutions may be utilized to perform the requisite surface oxide removal:

(1) concentrated hydrofluoric acid (HF) dip or a diluted HF solution;
(2) 50%–50% mixture of concentrated hydrochloric acid (HCl) with water ($H_2O$):
(3) 50% - 50% hydrobromic acid (HBr) with water;
(4) or any other nonoxidizing solution capable of dissolving the oxides of the elements of the semiconductor.

It is to be mentioned that the above list is provided as an example. Many other solutions and varying concentrations thereof may also be used during the surface oxide removal step 1 without departing from the spirit and scope of the invention.

Upon completion of the surface oxide removal step 1 for embodiments II, III, IV and V, the next step in the passivation process is the surface material etch 2. This surface material etch functions to remove any surface abnormalities from the semiconductor surface. The solution used in this step preferably comprises a dilute bromine and methanol solution which is applied to the semiconductor surface for a few seconds, typically between 5 and 20 seconds, if for example, a concentration 0.1 percent bromine by volume is used in methanol. Many other solutions and varying concentrations thereof may also be used during this surface material etch step 2 without departing from the spirit and scope of the invention.

More specifically, the solution used, must be capable of removing any nonstoichiometric surface layer, or any damaged surface layer without damaging or severely affecting the stoichiometry of the underlying bulk semiconductor material. For example, the following may be utilized to perform the requisite surface etch step 2:

(1) Bromine ($Br_2$) dissolved in methanol ($CH_3OH$), for example 0.1% $Br_2$ in methanol;

(2) Bromine ($Br_2$) dissolved in diamethylformamide ($HCON\ (CH_3)_2$), for example 0.1% $Br_2$ in dimethylformamide;

(3) Bromine ($Br_2$) dissolved in ethylene glycol (1,2-ethanediol, $HOCH_2\ CH_2\ OH$), for example 0.1% $Br_2$ in ethylene glycol; and (4) Bromine ($Br_2$) dissolved in hydrobromic acid (HBr), for example 0.1% $Br_2$ dissolved in hydrobromic acid.

After the completion of the time period required for the surface material etch step 2 (typically between 5 to 20 seconds) the etch must be stopped or quenched. If the etch is allowed to continue for longer than the typical times indicated not only will the damaged surface layer be removed but also too much of the stoichiometric underlying material will be removed.

The etch quench step used to stop the surface material etch varies with the particular embodiment being used. More exactly, it is at this stage in the passivation processing that commonality between the steps used throughout the various embodiments diverge. Accordingly, the description of the process steps that follow are described separately as they relate to each respective embodiment.

The first embodiment, as indicated in FIG. 1 by Roman numeral I, is utilized when the semiconductor to be treated has had very little chance for the oxidation of its surface to occur or for the surface to become nonstoichiometric. For example, a semiconductor having these characteristics is one that is typically generated in a vacuum system, as in molecular beam epitaxy (MBE). In instances where there has been little or no oxidation of the semiconductor surface, the surface oxide removal step 1 and the surface material etch step 2 may be bypassed.

Accordingly, the first process step for embodiment I comprises the aqueous sulfide soak 13. The semiconductor is placed in a sulfide solution and is preferably allowed to react for 20 to 90 minutes. The solution contemplated for use in the soak is typically aqueous ammonium sulfide solution (usually designated as $(NH_4)_2S$) or an aqueous ammonium polysulfide solution. The concentration of the solutions is not critical, however, a 20 to 24% concentration of sulfide or polysulfide is preferred. This preferred concentration is desirable so that a faster reaction will occur.

More particularly, this preferred concentration of sulfide solution exposes each surface atom of the semiconductor to contact with a nearby sulfide ion (approximately equivalent numbers) for maximum probability for reaction. "Sulfide ion", as used herein includes "hydrogen sulfide ion", which react similarly.

Other sulfides may be used during the aqueous soak sulfide step 13 without departing from the intent of the instant invention. For example, sodium sulfide or potassium sulfide solutions may be used, however, these solutions are generally less electrically desirable due to the increased presence of electrically contaminating ions. The soak step 13 functions to generate a reproducible sulfide film having very uniform properties over the surface of the semiconductor material.

At the end of this soak period the wafer is preferably rinsed (final rinse step 14) several times with methanol, isopropyl alcohol, or methanol-denatured ethanol, and quickly blown dry (drying step 15) with a stream of dry nitrogen gas (or, alternatively, spun free of liquid). This rinsing step 14 cleans the surface of any contaminants that remain from prior steps and drying step 15 prepares the surface for further conventional device fabrication. While methanol, isopropyl alcohol, and methanol-denatured ethanol are preferred rinsing agents, it is to be noted that any nonacidic solution which is miscible and dissolves surface contaminates without reacting with the surface film is contemplated for use by the instant process.

At this point the passivated wafer can be transferred to a storage container or passed along to the final stages of conventional device fabrication, which typically include thermal treatment, zinc sulfide deposition and final surface coating (e.g., silicon oxide or silicon nitride, or a combination thereof). The second embodiment, as indicated in FIG. 1 by Roman numeral II, uses an aqueous inorganic sulfide solution immediately after the surface material etch 2 in order to stop or quench the surface material etch. This step and the surface oxide removal step are performed in addition to the aqueous sulfide soak step 13 of embodiment I.

More particularly, after the completion of the surface oxide removal step 1 and the surface material etch step 2, the second embodiment utilizes a large excess of approximately 22% aqueous ammonium sulfide solution, which is poured into the etch, to both stop (or quench) the etch and to simultaneously introduce a high concentration of sulfide ions adjacent to the semiconductor surface, thereby sulfidizing the surface. (See FIG. 1, reference numeral 6.) This quenching action, preferably no longer than one or two seconds, permits the immediate formation of the insoluble sulfides of the elements of the semiconductor. When the semiconductor is $Hg_{1-x}Cd_xTe$, the mercury and cadmium will form insoluble sulfides to a greater extent than will the tellurium. These sulfide compounds are chemically and electrically non-reactive and function as the desired passivation layer.

The wafer with its passivating film is then rinsed (aqueous inorganic sulfide rinse 7) preferably with a fresh ammonium sulfide solution of the same concentration as used in step 6. This rinsing step 7 improves the quality of the passivation by removing unwanted reactant impurities and contamination (principally any adsorbed surface particulates formed from the etch product ions and introduced sulfide ions) before further processing takes place. Next, the wafer is transferred to a third bath or aqueous sulfide soak bath 13, comprising fresh ammonium sulfide solution (also of the same concentration as used in step 6) and is allowed to react for an additional time period, generally in the 20 to 90 minute range. During this time period a slight but improved increase occurs in the completion and depth to which sulfide atoms react with the surface atoms of the semiconductor. Upon completion of the soak 13, the remaining steps of the process as indicated by reference numerals 14 and 15, in FIG. 1, are completed. These steps 14 and 15 correspond to the similar steps as previously described for embodiment I.

A third embodiment, as identified in FIG. 1 by Roman numeral III, uses a nonaqueous inorganic sulfide solution rather than an aqueous solution as used in the second embodiment. More specifically, after steps 1 and 2 nonaqueous inorganic sulfide quench 3 is used to stop the previous etching step 2. The solution generally preferred is one of solid ammonium sulfide dissolved in carbon disulfide; and is generally made by reacting gaseous hydrogen sulfide and gaseous ammonia in carbon disulfide. This inorganic solution is the nonaqueous equivalent of an aqueous solution of ammonium sulfide as utilized in embodiment II.

Any similar nonaqueous inorganic sulfide solution can also be used with other organic solvents that have characteristics which permit a high concentration of ammonium sulfide to be dissolved therein. For example, ethyl disulfide with ammonium sulfide dissolved therein would be one of many acceptable alternatives. These ammonium sulfide saturated organic solutions are then poured into the etch solutions at the conclusion of the surface material etch step 2 in order to stop (or quench) the etch reaction and to sulfidize the wafer surface. The sulfidized surface is then subjected to an inorganic sulfide rinse step 4. The rinse solution comprises a fresh solution of solid ammonium sulfide dissolved in carbon disulfide as previously described for the etch quench step 3 above. Also, as described previously, the rinsing step 4 functions to improve the quality of the passivation by removing unwanted reactant impurities and contaminating ions before further process steps occur.

Once the impurities have been removed by the inorganic sulfide rinse step 4, the wafer is subjected to a soaking step 5. This soak step contemplates the use of an inorganic sulfide which has been dissolved in an organic solvent. The purpose of the inorganic sulfide soak step 5 is the same as that of soak step 13, namely, to generate a reproducible film having a very uniform set of properties over the surface of the wafer and to an adequate depth within the surface atoms of the semiconductor.

The inorganic sulfide normally dissolved in the nonaqueous (organic) solvent, for purposes of the inorganic sulfide soak step 5, is typically a fresh solution of solid ammonium sulfide dissolved in carbon disulfide or its equivalent as described and utilized in step 3 above. This step is performed for a nominal 20–90 minute period of time. The remaining steps for this particular embodiment of the process are indicated by reference numerals 14 and 15 as shown in FIG. 1. These steps correspond to similar steps as described for embodiment I supra.

A fourth embodiment of the passivation method described herein is one in which the surface material etch 2 is not stopped by the addition of a sulfide solution as done in embodiments II, III and V, (embodiment V described infra) but is instead stopped by flooding the surface material etch solution with a 10–15 excess ratio of alcohol (e.g., methanol). This step is indicated in FIG. 1 by reference numeral 8. The quenching action is preferably limited to one or two seconds. In this particular embodiment, the etch quench step 8 functions solely for the purpose of stopping the etch action and properly terminating the surface after material etch step 2. This function is different from the other embodiments contemplated for the inventive process in that the immediate formation of insoluble sulfides are not generated during this step.

The wafer is then subjected to an alcohol rinse step 9 and then is transferred to the aqueous sulfide soak step 13 which has been described previously. In tiffs embodiment, the sulfide soak functions to generate a contaminant-free reproducible sulfide film by reaction with the sulfidizable atoms at the surface of the semiconductor material. The remaining steps for this fourth embodiment are indicated by reference numerals 14 and 15 as shown in FIG. 1. These steps correspond to similar steps as previously described. The etch quench 8 and the alcohol rinse 9 are advantageous since their action facilitates the sweeping away of contaminants from the surface of the wafer before a sulfide film is produced.

A fifth embodiment of the instant invention contemplates the use of an etch quench step 10 utilizing an organic sulfide in an organic solvent in order to quench or stop the surface material etch step 2. The duration of the quench is preferably 2-3 seconds, however, the duration is not critical. Many organic solvent solutions, such as diethyl sulfide, diethyl disulfide or ethyl hydrosulfide which contain organic sulfides acting as the sulfidization agent using carbon disulfide as the solvent or another organic solvent in which the organic sulfide is soluble, such as methanol or ethylene glycol, are within the scope of the invention contemplated herein.

It is to be noted, that the concentration of reactive sulfur in carbon disulfide may be increased by the treatment of carbon disulfide or the carbon disulfide containing the dissolved organic sulfides by ultraviolet light. A high intensity level of ultraviolet light will generate within the carbon disulfide free radicals including the free radical of sulfur. This free radical of sulfur would be very reactive with the surface of the semiconductor thereby producing sulfides of the constituent elements. Sulfur free radicals are very long lived in this ambient, reportedly up to approximately 30 minutes in carbon disulfide solutions, so that a high concentration of them could be formed prior to the use of the carbon disulfide solution in the etch quench step 10.

Upon the completion of the etch quench step 10 the wafer is subjected to an organic sulfide rinse 11. The solution comprising the rinse is a fresh solution of the same concentration and composition as used in the etch quench step 10 delineated previously. This organic sulfide rinse step 11 functions to improve the quality of the passivation by removing unwanted reactant impurities and contaminants before further process steps occur. Next, the wafer is transferred to an organic sulfide soak step 12, comprising a fresh solution of the organic sulfide, described previously for steps 10 and 11. The wafer is allowed to react for a time period generally in the 20–90 minute range. The remaining steps of the process relating to embodiment V are indicated by reference numerals 14 and 15 in FIG. 1. These later steps correspond to similar steps as described for embodiment I, supra.

Figure 2:
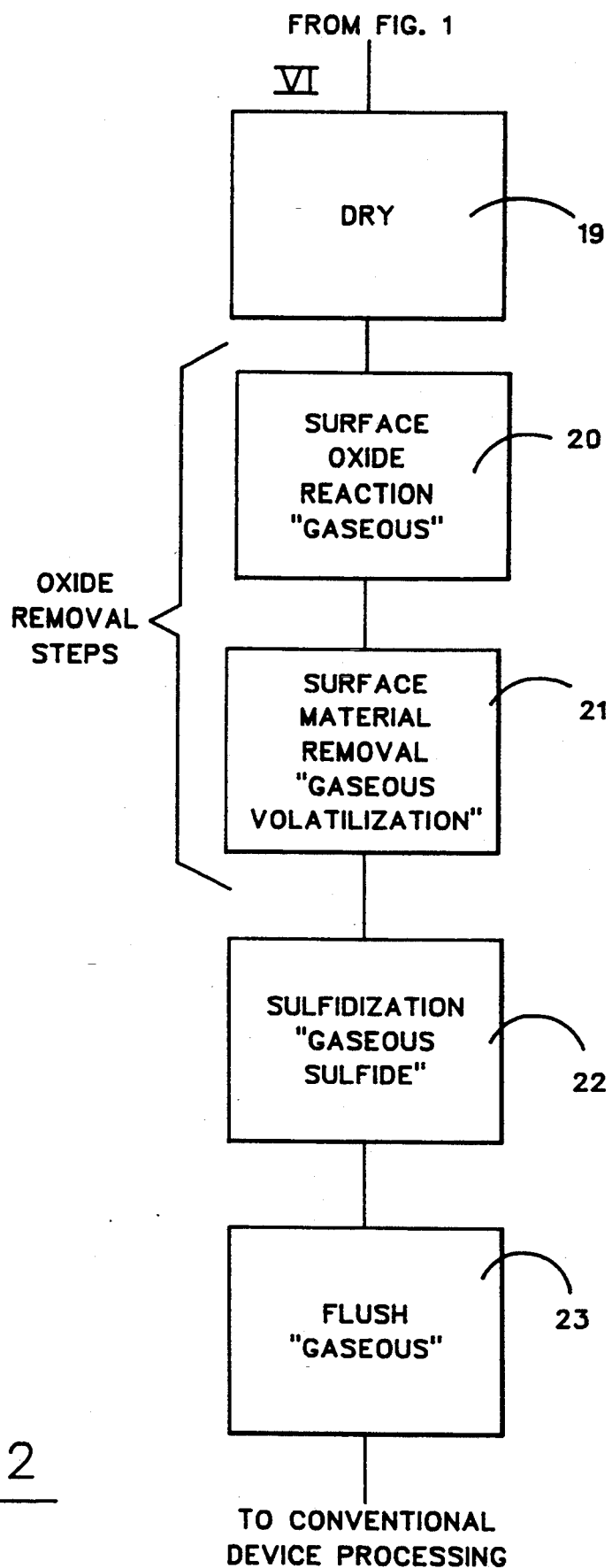
FIG. 2 Diagrammatic flow chart of a sixth embodiment of the sulfide surface passivation process.

Referring now to FIGS. 1 and 2, and more specifically to FIG. 2, a sixth embodiment of the invention is diagrammed. This embodiment is preferably performed after the usual liquid phase removal of any undesirable nonstoichiometric surface layer of HgCdTe. More particularly, the process steps of embodiment IV are followed up to and including the alcohol rinse step 9.

Next, the surface is dried, Step 19, via a stream of dry nitrogen gas. The surface is then etched by gases in essentially a vacuum system arrangement to remove any oxide traces. (See FIG. 2, steps 20 and 21, referred to as "oxide removal steps)." More exactly, during the surface oxide reaction step 20, the wafer is placed in a reaction chamber capable of applying a vacuum or introducing a reactant gas. The wafer is warmed slightly, preferably to 75 degrees C. and hydroiodic acid (HI) gas is introduced at a pressure between 0.5 and 1.0 atmosphere for about 60 seconds to permit the surface oxides to be converted to iodides.

The hydroiodic acid gas is then pumped out of the reaction chamber under a vacuum of at least $10^{-2}$ Torr for the most efficient removal of the volatile surface iodide compounds of the oxidizable elements of the semiconductor (step 21). These materials can also be moved from the warm surface by a moving stream of warm (approximately 75 degrees C.) inert gas (nitrogen or argon, for example) if an atmospheric pressure technique rather than vacuum is used. By either method, the volatilized iodides will deposit on a colder portion of the system. A refrigerated "cold finger" can be used to insure their collection at a convenient and removable trap down stream or away from the clean semiconductor surface.

Finally, this sequence is followed by a sulfidization step 22. This step involves the introduction of a sulfide-bearing gas like hydrogen sulfide or a volatile organic sulfide so that the warm surface generates in situ sulfides as a passivating film. Example of acceptable organic sulfide gases include methyl sulfide, dimethyl disulfide and ethyl hydrosulfide. Removal of the generating sulfide gas then would be followed by a vacuum or inert gas flushing treatment (step 23). As in all prior embodiments, conventional processing follows with the vacuum deposition of an insulation layer, such as zinc sulfide or silicon dioxide, to permit final deposition and delineation of the metallization used as conductors of the detector signals.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the method steps may be resorted to without departing from the spirit and scope of the invention.

Now that the invention has been described what is claimed is:

1. A passivation method comprising the steps of:
    selecting a compound semiconducting material having a solid surface, said material being able to chemically form stable sulfide compounds in the presence of sulfide ions, or in the presence of hydrogen sulfide ions, or in the presence of molecules containing sulfur, or in the presence of free radicals of sulfur, when the surface is at the same electrical potentials as the ions, molecules, or radicals;
    removing surface oxide from said solid surface;
    etching said solid surface to obtain a periodic atomic structure of said solid surface;
    applying a nonaqueous inorganic sulfide solution to said solid surface, said nonaqueous inorganic sulfide solution being selected from a group of materials comprising solid ammonium sulfide, dissolved in carbon disulfide or dissolved in ethyl disulfide;
    rinsing said solid surface to remove contaminants from said solid surface; and
    applying a passivating material to said solid surface in order to chemically form a native sulfide film on said surface, said passivating material containing sulfide ions, or hydrogen sulfide ions, or free radicals of sulfur, or molecules containing sulfur, and said surface being at the same electrical potential as the ions, molecules, or radicals.

2. A passivation method comprising the steps of:
    selecting a compound semiconducting material having a solid surface, said material being able to chemically form stable sulfide compounds in the presence of sulfide ions, or in the presence of hydrogen sulfide ions, or in the presence of molecules containing sulfur, or in the presence of free radicals of sulfur, when the surface is at the same electrical potential as the ions, molecules, or radicals:
    removing surface oxide from said solid surface;
    etching said solid surface to obtain a period atomic structure of said solid surface;
    applying an aqueous inorganic sulfide solution to said solid surface to terminate said etching;
    said aqueous inorganic sulfide solution being selected from a group of materials comprising ammonium sulfide and ammonium polysulfide;
    rinsing said solid surface to remove contaminants from said solid surface; and
    applying a passivating material to said solid surface in order to chemically form a native sulfide film on said solid surface, said passivating material containing sulfide ions, or hydrogen sulfide ions, or free radicals of sulfur, or molecules containing sulfur, and said surface being at the same electrical potential as the ions, molecules, or radicals.

3. A passivation method comprising the steps of:
    removing surface oxide from said a solid surface of a compound semiconducting material comprising mercury cadmium telluride;
    etching said solid surface to obtain a periodic atomic structure of said solid surface;
    quenching said etching of said surface by applying an organic sulfide solution to said solid surface to terminate said etch, said organic sulfide solution being selected from a group of materials comprising diethyl sulfide, diethyl disulfide and ethyl hydrobromide, and said group of materials being dissolved in methanol, ethylene glycol, or carbon disulfide;
    rinsing said solid surface to remove contaminants from said solid surface; and
    applying a passivating material to said solid surface in order to chemically form a native sulfide film on said solid surface, said passivating material containing sulfide ions, or hydrogen sulfide ions, or free radicals of sulfur, or molecules containing sulfur, and said surface being at the same electrical potential as the ions, molecules, or radicals.

4. A passivation method comprising the steps of:

removing surface oxide from said a solid surface of a compound semiconducting material comprising mercury cadmium telluride;

etching said solid surface to obtain a periodic atomic structure of solid surface;

quenching said etching of said solid surface by applying a nonsulfide, nonaqueous solution to said solid surface to quench said etch, said nonsulfide, nonaqueous solution being selected from a group of materials comprising alcohol;

rinsing said solid surface to remove contaminants from said solid surface; and applying passivating material to said solid surface in order to chemically form a native sulfide film on said solid surface, said passivating material containing sulfide ions, or hydrogen sulfide ions, or free radicals of sulfur, or molecules containing sulfur, and said surface being at the same electrical potential as the ions, molecules, or radicals.

5. A passivation method comprising the steps of:

selecting a compound semiconductor material having a solid surface, said material being able to chemically form stable sulfide compounds in the presence of sulfide ions, or in the presence of hydrogen sulfide ions, or in the presence of molecules containing sulfur, or in the presence of free radicals of sulfur, when the surface is at the same electrical potential as the ions, molecules, or radicals;

removing surface oxide from said solid surface;

etching said solid surface to obtain a periodic atomic structure of said solid surface;

quenching said etching of said solid surface;

applying a nonaqueous inorganic sulfide solution to said solid surface to remove contaminants from said solid surface, said nonaqueous inorganic sulfide solution being selected from a group of materials comprising solid ammonium sulfide, dissolved in carbon disulfide or dissolved in ethyl disulfide; and applying a passivating material to said solid surface in order to chemically form a native sulfide film on said solid surface, said passivating material containing sulfide ions, or hydrogen sulfide ions, or free radicals of sulfur, or molecules containing sulfur, and said surface being at the same electrical potential as the ions, molecules, or radicals.

6. A passivation method comprising the steps of:

selecting a compound semiconducting material having a solid surface, said material being able to chemically form stable sulfide compounds in the presence of sulfide ions, or in the presence of hydrogen sulfide ions, or in the presence of molecules containing sulfur, or In the presence of free radicals of sulfur, when the surface is at the same electrical potential as the ions, molecules, or radicals;

removing surface oxide from said solid surface;

etching said solid surface to obtain a periodic atomic structure of said solid surface;

quenching said etching of said solid surface;

applying an aqueous inorganic sulfide solution to said solid surface to remove contaminants from said solid surface, said aqueous inorganic sulfide solution being selected from a group of materials comprising ammonium sulfide and ammonium polysulfide; and applying a passivating material to said solid surface in order to chemically form a native sulfide film on said solid surface, said passivating material containing sulfide ions, or hydrogen sulfide ions, or free radicals of sulfur, or molecules containing sulfur, and said surface being at the same electrical potential as the ions, molecules, or radicals.

7. A passivation method comprising the steps of:

removing surface oxide from said a solid surface of a compound semiconducting material comprising mercury cadmium telluride;

etching said solid surface to obtain a periodic atomic structure of said solid surface;

quenching said etching of said solid surface;

rinsing said solid surface to remove contaminants from said solid surface by applying an organic sulfide solution to said solid surface to remove contaminants from said solid surface, said organic sulfide solution being selected from a group of materials comprising diethyl sulfide, diethyl disulfide and ethyl hydrosulfide, and said group of materials being dissolved in methanol, ethylene glycol, or carbon disulfide; and applying a passivating material to said to solid surface in order to chemical form a native sulfide film on said solid surface, said passivating material containing sulfide ions, or hydrogen sulfide ions, or free radicals of sulfur, or molecules containing sulfur, and said surface being at the same electrical potential as the ions, molecules, or radicals.

8. A passivation method comprising the steps of:

removing surface oxide from said a solid surface of a compound semiconducting material comprising mercury cadmium telluride:

etching said solid surface to obtain a periodic atomic structure of said solid surface:

quenching said etching of said solid surface;

rinsing said solid surface to remove contaminants from said solid surface by applying a nonsulfide, nonaqueous solution to said solid surface to remove contaminants from said solid surface, said nonsulfide, nonaqueous solution being selected from a group of materials comprising alcohols; and applying a passivating material to said solid surface in order to chemically form a native sulfide film on said surface, said passivating material containing sulfide ions, or hydrogen sulfide ions, or free radicals of sulfur, or molecules containing sulfur, and said surface being at the same electrical potential as the ions, molecules, or radicals.

9. A passivation method comprising the steps of:

removing surface oxide from said a solid surface of a compound semiconducting material comprising mercury cadmium telluride by drying said solid surface and gaseously removing oxides from said solid surface; said gaseous removal of oxides step further comprising the steps of:

introducing a reactant gas to convert oxides to iodides;

said reactant gas is selected from a group of materials comprising hydroiodic acid; and removing said iodides from said solid surface;

gaseously etching said solid surface to obtain a periodic atomic structure of said solid surface;

quenching said etching of said solid surface;

rinsing said solid surface to remove contaminants from said solid surface; and applying a passivating material to said solid surface in order to chemically form a native sulfide film on said solid surface, said passivating material containing sulfide ions, or hydrogen sulfide ions, or free radicals of sulfur, or molecules containing sulfur, and said surface being at the same electrical potential as the ions, molecules, or radicals.

10. A passivation method comprising the steps of:

removing surface oxide from said a solid surface of a compound semiconducting material comprising mercury cadmium telluride;

etching said solid surface to obtain a periodic atomic structure of said solid surface;

quenching said etching of said solid surface;

rinsing said solid surface to remove contaminants from said solid surface by applying a liquid organic sulfide to said solid surface to remove contaminants from said solid surface, said liquid organic sulfide being selected from a group of materials comprising diethyl sulfide, diethyl disulfide and ethyl hydrosulfide; and applying a passivating material to said solid surface in order to chemically form a native sulfide film on said solid surface, said passivating material containing sulfide ions, or hydrogen sulfide ions, or free radicals of sulfur, or molecules containing sulfur, and said sulfur being at the same electrical potential as the ions, molecules, or radicals.

* * * * *